(12) United States Patent
Yazawa

(10) Patent No.: US 6,262,397 B1
(45) Date of Patent: Jul. 17, 2001

(54) HEAT TREATMENT APPARATUS AND HEAT TREATMENT METHOD

(75) Inventor: Minoru Yazawa, Nakakoma-gun (JP)

(73) Assignee: Tokyo Electron Ltd., Tokyo (JP)

( * ) Notice: Subject to any disclaimer, the term of this patent is extended or adjusted under 35 U.S.C. 154(b) by 0 days.

(21) Appl. No.: 09/538,158

(22) Filed: Mar. 29, 2000

(30) Foreign Application Priority Data

Mar. 30, 1999 (JP) .................................... 11-090101

(51) Int. Cl.[7] ........................................................ A21B 1/00
(52) U.S. Cl. ........................ 219/411; 219/390; 118/724; 118/725; 392/416
(58) Field of Search ..................................... 219/390, 405, 219/411; 392/416, 418; 118/724, 725, 50.1

(56) References Cited

U.S. PATENT DOCUMENTS 5,679,165 * 10/1997 Maeda et al. ..................... 118/719
5,707,500 * 1/1998 Shimamura et al. ............ 204/298.03
6,121,579 * 9/2000 Akoi et al. ........................ 219/390

FOREIGN PATENT DOCUMENTS 5-99752    4/1993   (JP) .
7-134069   5/1995   (JP) .

* cited by examiner

*Primary Examiner*—Teresa Walberg
*Assistant Examiner*—Shawntina Fuqua
(74) *Attorney, Agent, or Firm*—Pillsbury Winthrop LLP

(57) ABSTRACT

From a side surface of a susceptor 2, in parallel with a surface of the susceptor 2 and directing toward a center portion, a sensor insertion hole 21 is bored, in this sensor insertion hole 21, a temperature sensor 30 is fixed. A tip of a sensor insertion hole 21 is communicated with a heat rays guide hole 22 that is bored from an upper surface of the susceptor 2 vertical to the surface. At a junction of a sensor insertion hole 21 and a heat rays guide hole 22, a reflector 23 is formed with an angle of approximately 45° tilted with respect to an upper surface of a susceptor 2. Heat rays radiated from a wafer W are led into a heat rays guide hole 22 and reflected at a reflector 23 to guide into a sensor insertion hole 21 and detect.

14 Claims, 9 Drawing Sheets

HEAT TREATMENT APPARATUS AND HEAT TREATMENT METHOD

BACKGROUND OF THE INVENTION

1. Field of the Invention

The present invention relates to a manufacturing apparatus of semiconductors, in particularly details to a heat treatment apparatus of substrates to be processed such as glass substrates for liquid crystal display devices (hereinafter a liquid crystal display device is referred to as a "LCD") and silicon wafers (hereinafter a silicon wafer is simply referred to as a "wafer").

2. Description of the Related Art

So far, in implementing heat treatment to substrates to be processed such as LCDs and wafers in the manufacturing process of semiconductors, on a susceptor regulated in advance at a prescribed temperature, the substrates are disposed to be heat-treated by an amount of heat supplied from the susceptor. At this time, due to the heat treatment temperatures at which the substrates are heated, quality and yield of semiconductor products are largely determined. Accordingly, the heat treatment temperatures, in specific, the temperatures of the susceptor must be regulated with great precision. Therefore, a temperature sensor is inserted into the susceptor to regulate, based on temperatures of the susceptor detected by the temperature sensor, on off and output of a heater. Thereby, the temperatures of the susceptor are supervised. As the temperature sensor, a thermocouple temperature sensor using thermocouple is generally used.

However, there are problems of accuracy and durability such that the thermocouple temperature sensor is poor in accuracy and drastically deteriorates due to the heat. Further, the existing thermocouple temperature sensor only indirectly detects the heat treatment temperatures of the substrate through the temperatures of the susceptor. Accordingly, there is an essential problem that the sensor can not directly detect the temperatures of the substrate itself.

To the ends, various propositions have been disclosed. For instance, Japanese Patent Laid-open Application (KOKAI) No. HEI 5-99752 discloses a method for measuring temperatures in which with an infrared radiation thermometer, temperatures of the substrate during transportation by transporting arm are detected. This method, however, detects only the temperatures of the substrate during transportation. Accordingly, there is a problem that this method can not detect the temperatures when heat-treating by the susceptor.

On the other hand, a method for detecting the temperatures of the substrate in a state being disposed to process is disclosed in Japanese Patent Laid-open Application (KOKAI) No. HEI 7-134069. In this method, in the neighborhood of the center of a susceptor, a penetrating hole is vertically bored with respect to a surface of the susceptor. At the lower side of the penetrating hole, a radiation thermometer is disposed to directly detect infrared rays radiated from the substrate. Thereby, the temperatures of the substrate are directly detected.

In this method, however, a tip of the radiation thermometer inserted from between the susceptor and heating lamps disposed thereunder is disposed in the neighborhood of an upper surface of the susceptor. Accordingly, the radiation thermometer has to be bent by an approximately right angle. In the publication of the above invention, a radiation thermometer jacketed in a cylindrical covering pipe is bent by an approximately right angle to use.

However, when the covering pipe is bent, the bent portion becomes thin, or becomes brittle. As a result of this, from this portion, the infrared rays tend to enter the covering pipe. Accordingly, there is a problem that the infrared radiation thermometer tends to gather heat rays generated from other than the substrate, such as infrared rays from heating lamps.

SUMMARY OF THE INVENTION

The present invention is made to solve the above problems.

That is, the object of the present invention is to provide a heat treatment apparatus that does not detect the heat other than that radiated from a substrate to be processed as noise, and can regulate temperatures of the substrate with high precision.

A heat treatment apparatus of the present invention comprises a susceptor for heating a substrate to be processed, a sensor insertion hole, a heat rays guide hole, a temperature sensor, a heater for heating the susceptor, and a regulator for regulating the heater. The sensor insertion hole is bored from a side surface of the susceptor toward a center portion thereof. The heat rays guide hole communicates an upper surface of the susceptor and a tip of the sensor insertion hole and guides the heat rays radiated from the substrate. The temperature sensor is inserted into the sensor insertion hole.

In the above heat treatment apparatus, the temperature sensor is preferable to be a radiation thermometer.

At a junction of the tip of the sensor insertion hole and the heat rays guide hole, it is preferable for a reflector to be formed 45° slanted with respect to the surface of the susceptor.

The reflector is preferable to have a surface of emissivity of 0.1 or less.

Just below the heat rays guide hole, the tip of the temperature sensor may be disposed.

Another heat treatment apparatus of the present invention comprises a susceptor, a first sensor insertion hole, a heat rays guide hole, a first temperature sensor, a second sensor insertion hole, a second temperature sensor, a heater for heating the susceptor, and a regulator for regulating the heater. The susceptor heats a substrate to be processed. The first sensor insertion hole is bored from a side surface of the susceptor toward a center portion thereof. The heat rays guide hole communicates an upper surface of the susceptor and a tip of the first sensor insertion hole, and guides the heat rays from the substrate. The first temperature sensor is inserted into the first sensor insertion hole. The second sensor insertion hole is bored from a side surface of the susceptor toward a center portion thereof, and has the tip thereof on the same circle with the heat rays guide hole.

In the above heat treatment apparatus, the first temperature sensor is preferable to be a radiation thermometer.

The second temperature sensor may be a radiation thermometer or a thermocouple temperature sensor.

A still another heat treatment apparatus of the present invention comprises a susceptor, a sensor insertion hole, a heat rays guide hole, a radiation thermometer, heaters for heating the susceptor, a temperature estimation means, and a regulator for regulating the heaters. The susceptor heats a substrate to be processed. The sensor insertion hole is bored from a side surface of the apparatus toward a center portion thereof. The heat rays guide hole communicates an upper surface of the susceptor and a tip of the sensor insertion hole and guides heat rays radiated from the substrate. The radiation thermometer is inserted into the sensor insertion hole.

The temperature estimation means estimate temperatures of each portion of the susceptor based on temperatures detected by the radiation thermometer. The regulator regulates the heaters based on the detected temperatures and the estimated temperatures.

In a heat treatment method of the present invention, heat rays radiated from a substrate to be processed is introduced into a heat rays guide hole disposed on a surface of a susceptor. Then, the heat rays is reflected toward a sensor insertion hole that is communicated with a bottom of the heat rays guide hole. Thereby, a temperature sensor that is inserted into the sensor insertion hole detects the heat rays. Based on the detected temperatures, heaters for heating the susceptor are regulated.

In another heat treatment method of the present invention, heat rays radiated from a substrate to be processed is guided into a heat rays guide hole disposed on a surface of a susceptor. Then, the heat rays are reflected toward a first sensor insertion hole communicated with a bottom of the heat rays guide hole. Thereby, a first temperature sensor that is inserted into the first sensor insertion hole detects the heat rays. Meanwhile, among the heat rays supplied from heaters to the susceptor, the heat rays permeating into a second sensor insertion hole that is disposed within the susceptor are detected by a second temperature sensor inserted in a second sensor insertion hole. From temperatures detected by the first temperature sensor and temperatures detected by the second temperature sensor, net temperatures of the substrate are obtained. Based on thus obtained net temperatures of the substrate, heaters for heating the susceptor are regulated.

According to the present invention, a heat rays guide hole is disposed on an upper surface of a susceptor to guide the heat rays radiated from a substrate to be processed through the heat rays guide hole directly to a temperature sensor. Accordingly, temperatures of the substrate are directly detected.

In addition, the temperature sensor is disposed in a sensor insertion hole disposed inside of a susceptor. As a result of this, without catching the heat rays radiated from such as the heaters other than the substrate, the temperatures of the substrate can be detected with high precision.

DESCRIPTION OF PREFERRED EMBODIMENTS (A First Mode of Implementation)

Figure 1:
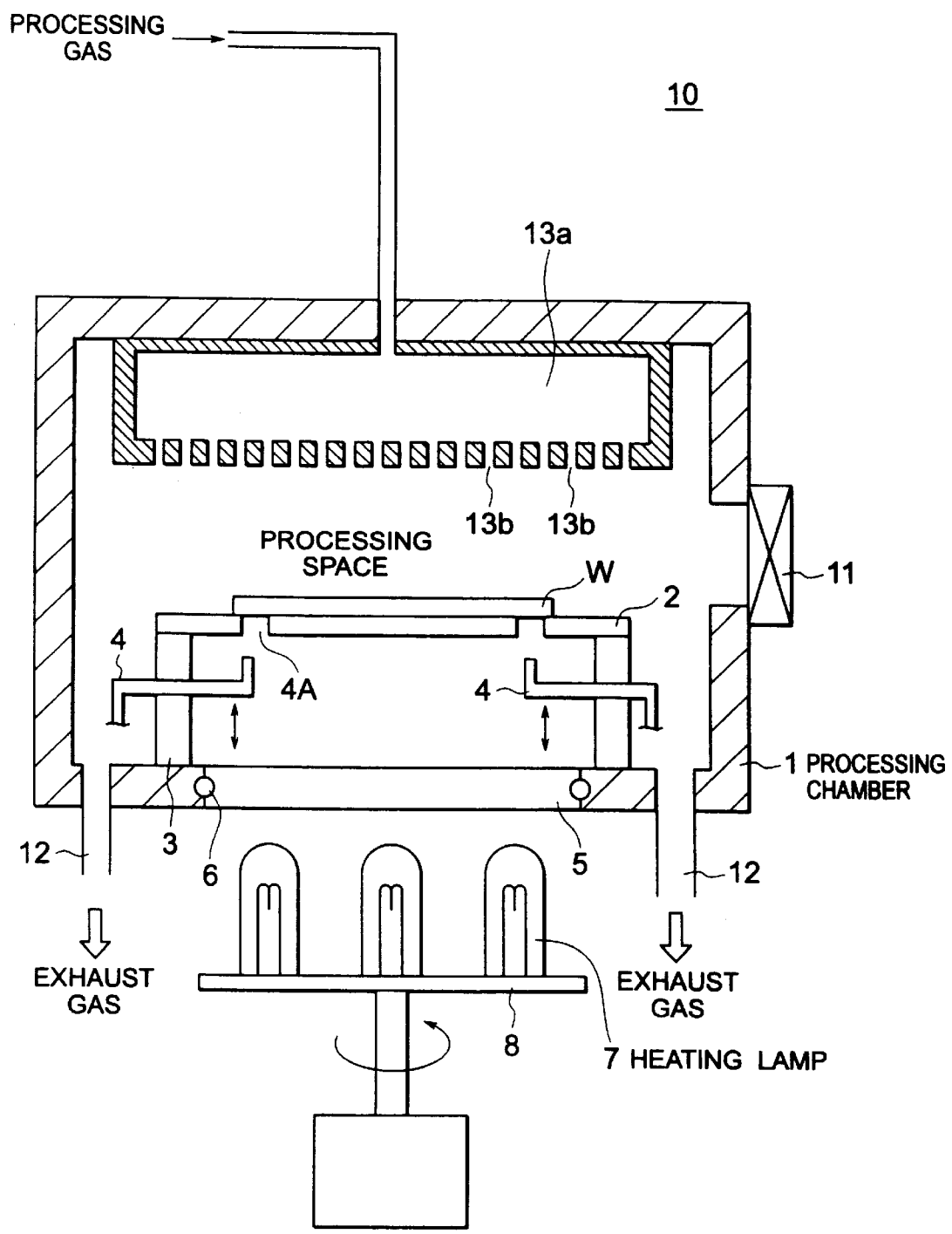
FIG. 1 is a vertical cross sectional view showing an entire constitution of a CVD processor equipped with a heat treatment apparatus involving the present invention.

In the following, a cleaning method involving a mode of implementation of the present invention, and a cleaning device will be explained. FIG. 1 is a vertical cross sectional view showing an entire constitution of a CVD processor equipped with a susceptor involving the present invention.

As shown in FIG. 1, the CVD processor 10 is provided with a processing chamber 1 (chamber) formed in approximate cylinder of for instance aluminum or the like.

At a ceiling of the processing chamber 1, a showerhead 13 for feeding therein a processing gas is disposed. In the showerhead 13, a processing gas fed through a processing gas feed conduit 14 is once diffused into a diffusing chamber 13a of the showerhead 13. Thereafter, the processing gas is discharged from a plurality of discharge holes 13b, 13b, —bored in a bottom plate of the diffusing chamber 13a toward a wafer W disposed on a susceptor 2.

Inside of the processing chamber 1, a susceptor 2 composed of graphite or the like for disposing for instance a wafer W as a substrate to be processed is supported from a bottom through props 3. For materials of the susceptor 2, for instance, amorphous carbon, composite carbon, AlN (aluminum nitride) or the like can be used. Below the susceptor 2, lifter pins 4 made of quartz are disposed. The lifter pins 4 can be moved up and down by a not shown elevating means. The lifter pins 4 pierce through penetrating holes 4A disposed in the susceptor 2 to lift the wafer W in getting in and out the wafer W.

At the bottom of the processing chamber 1, a transparent window 5 made of for instance quartz is air-tightly attached through a sealing member 6. Below the processing chamber 1, a plurality of intensive heating lamps 7 consisting of halogen lamps or the like is disposed on a rotary table 8. The heat rays from the lamps 7 heats the susceptor 2 in the processing chamber 1, the heat rays thereof indirectly heating the wafer W to a prescribed temperature, for instance approximately 400° C. to maintain there. The rotary table 8 is connected to a rotary unit 9 consisting of a motor or the like to be capable of rotating, the lamps 7 being rotated through the rotary unit 9 to heat the wafer W uniformly in a plane thereof.

On a sidewall of the processing chamber 1, a gate valve 11 is disposed to open and close when getting in and out the wafer W to the chamber 1. At a periphery of the bottom of the chamber, exhaust outlets 12 are disposed connected to a not shown vacuum pump, thereby the inside of the chamber being evacuated.

Figure 2:
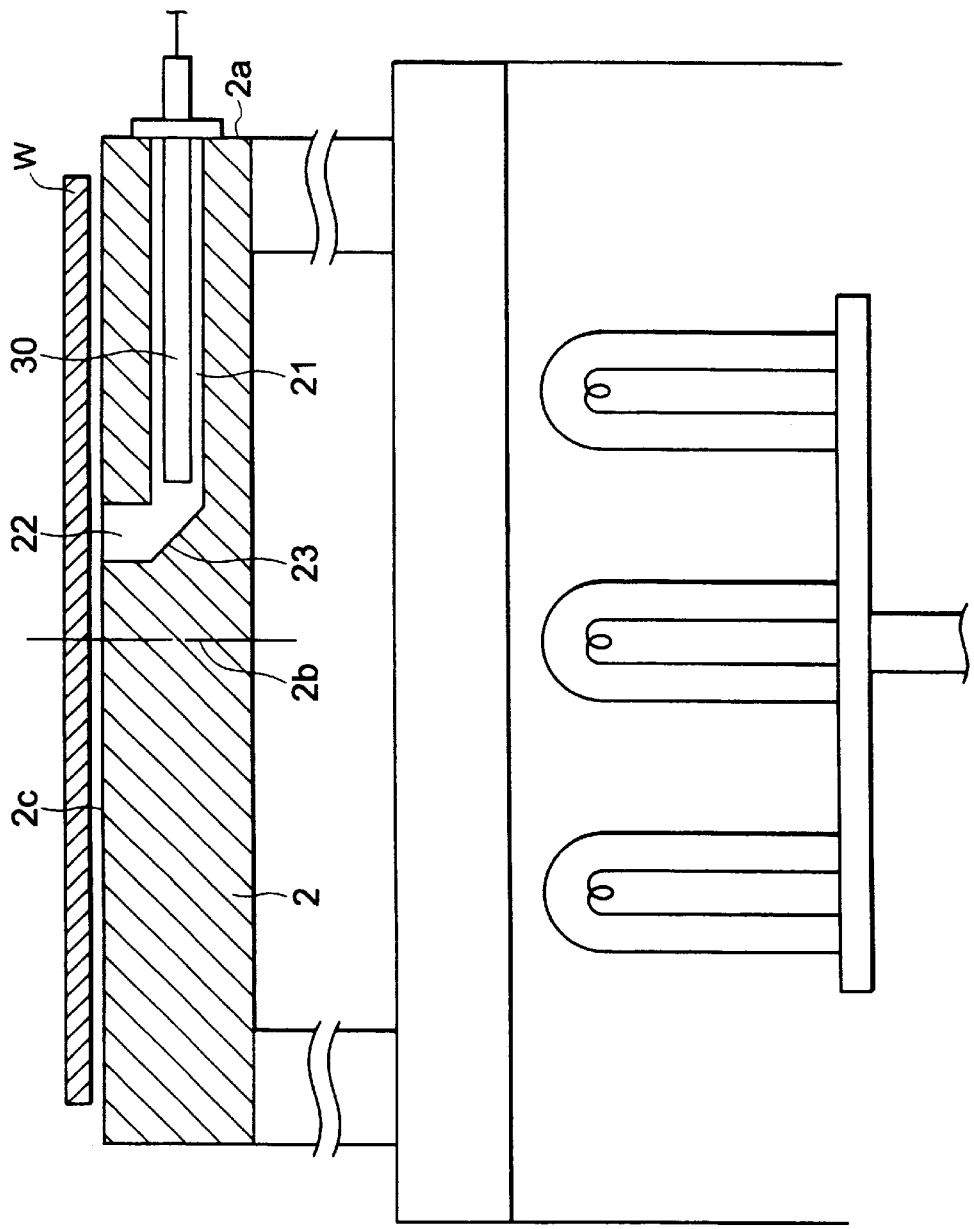
FIG. 2 is a vertical cross sectional view diagrammatically showing surroundings of a susceptor involving the present invention.
Figure 3:
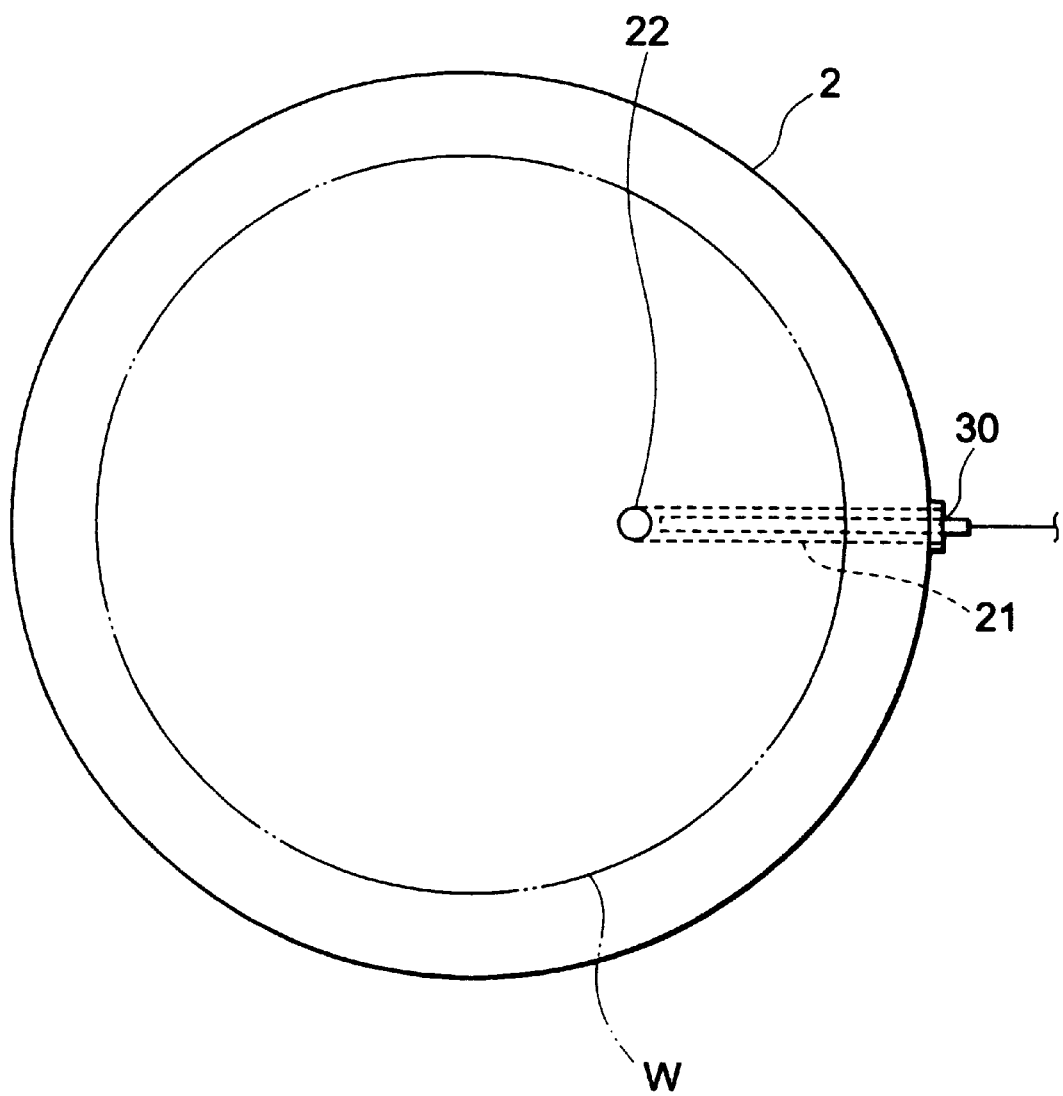
FIG. 3 is a plan view of a susceptor involving the present invention.

Next, a second susceptor 2 involving the present invention will be explained. FIG. 2 is a vertical cross sectional view diagrammatically showing the surroundings of the present susceptor 2. FIG. 3 is a plan view of the susceptor 2.

As shown in FIGS. 2 and 3, in the susceptor 2, a sensor insertion hole 21 is disposed inside thereof. The sensor insertion hole 21 is bored from a side surface 2a of the susceptor 2 toward a center portion 2a of the susceptor 2. That is, the sensor insertion hole 21 is formed in parallel with a surface 2c of the susceptor 2.

In an upper surface 2c of the susceptor 2, a hole 22 for introducing heat rays radiated from the susceptor is disposed. The heat rays guide hole 22 is bored from an upper surface 2c of the susceptor 2 approximately vertical to the upper surface 2c toward the inside along a thickness direction thereof. The bottom of the heat rays guide hole 22 is communicated with the tip of the sensor insertion hole 21. At a junction where the heat rays guide hole 22 and the sensor insertion hole 22 intersect, a planar reflector 23 is formed. The reflector 23, as will be explained later, is preferable to slant at an angle of 45° with respect to an upper surface 2c of the susceptor 2, that is, with respect to an extending direction of the sensor insertion hole 21. In addition, a surface of the reflector 23 is preferable to be finished smooth to be specular, or to be finished to be a state, by implementing coating or the like, to tend to reflect the heat rays. Further, similarly, inner surfaces of the heat rays guide hole 22 and the sensor insertion hole 21 also are preferable to be finished, due to implementation of mirror finishing or coating, into a state to tend to reflect the heat rays. The state where the heat rays are highly reflected is a state in which emissivity is, for instance, 0.1 or less (reflectivity of 0.9 or more).

The coating may be implemented not only on the reflector 23, but also on an entire inner surface of a sensor insertion hole 21 and a heat rays guide hole 22 or only on a part thereof.

Inside of the sensor insertion hole 21, in a state as shown in FIGS. 2 and 3, a temperature sensor 30 is inserted to fix. Here, as the temperature sensor 30 that is attached to a sensor insertion hole 21, a "radiation thermometer" that can measure temperatures by detecting so-called heat rays (infrared rays) is preferable.

The temperature sensor is connected to a CPU as a regulator. The CPU, based on detected temperature signals transmitted from the temperature sensor, regulates an output of heating lamps as heater.

Figure 4:
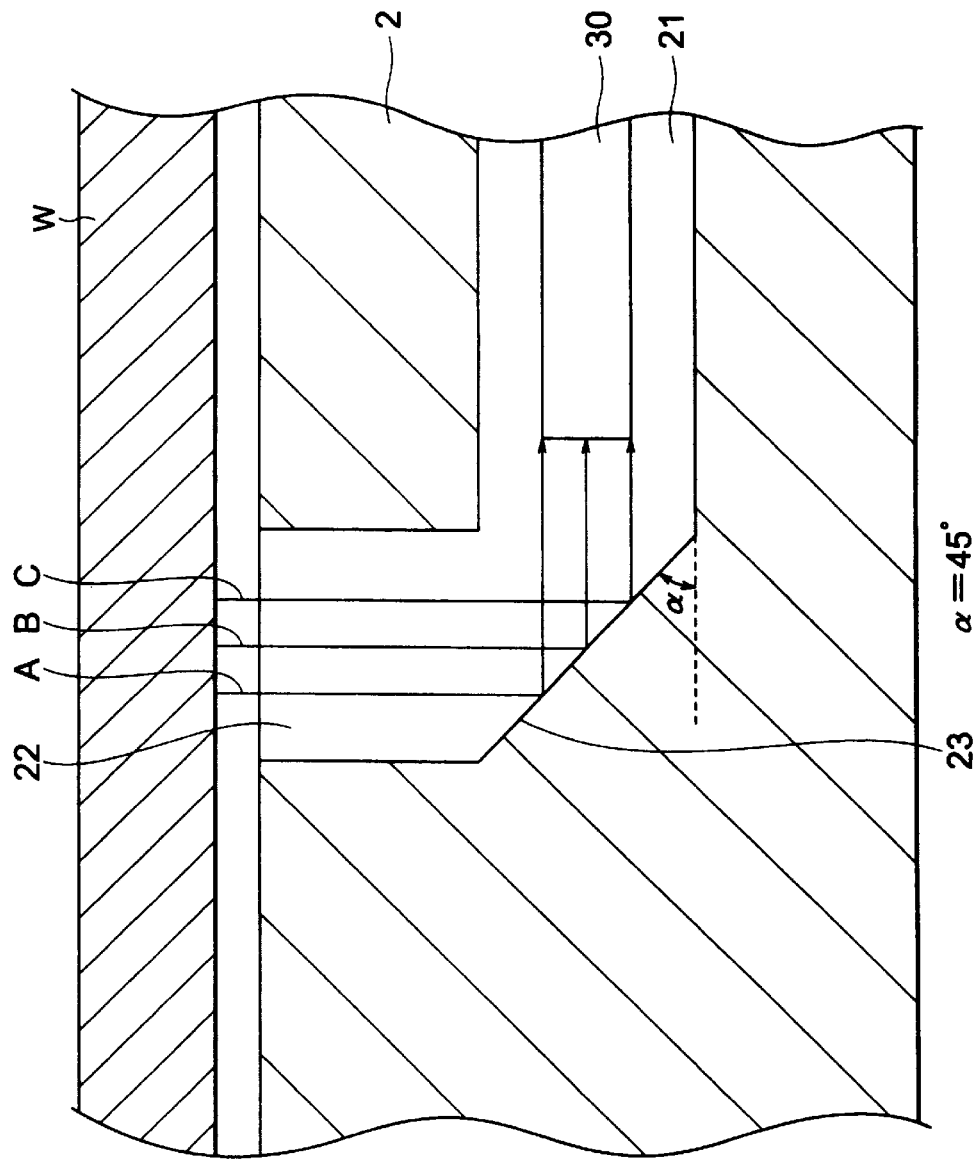
FIG. 4 is a vertical cross sectional view in which the surroundings of a heat rays guide hole of a susceptor is partly enlarged.

Next, a temperature measurement state during implementing heat treatment to a wafer W on a susceptor 2 involving the present embodiment will be explained. FIG. 4 is a vertical cross sectional view in which the surroundings of the heat rays guide hole 22 of the susceptor 2 is partly enlarged.

As shown in FIG. 4, heat rays radiated from heating lamps (not shown in the figure) are fed through a transparent window (not shown in the figure) and a susceptor 2 on a wafer W. Thereby, the temperature of the wafer W is raised to radiate the heat rays, that is, infrared rays. Now, of a lower surface of the wafer W disposed on the susceptor 2, we pay attention to a portion that comes in the neighborhood just above a heat rays guide hole 22. The heat rays A to C radiated from the wafer W, as shown by arrows in FIG. 4, propagate downwards approximately vertical with respect to a lower surface of the wafer W. At the bottom of the heat rays guide hole 22, a reflector 23 is disposed. The reflector 23, as shown in FIG. 4, slants at an angle of 45° with respect to an upper surface 2c of the susceptor 2, that is, with respect to an extension of the sensor insertion hole 21. Accordingly, the heat rays A to C are incident at an incident angle of 45° with respect to the reflector 23. The most of the incident heat rays A to C is reflected at a surface of the reflector 23. The reflected heat rays A to C go out in a direction of an angle of 45° that is the same with the incidence angle with respect to the reflector 23. Accordingly, as shown in FIG. 4, the heat rays A to C proceed in parallel with an upper surface 2c of the susceptor 2, that is, in a direction of extension of a sensor insertion hole 21 in a sensor insertion hole 21 toward right side in the figure. Since a temperature sensor 30 is disposed in the sensor insertion hole 21, the heat rays A to C reach the temperature sensor 30 and are caught by the temperature sensor 30 as heat.

There are, other than the above heat rays A to C, heat rays that are radiated from for instance the lower surface of the wafer W at a certain angle with respect to the surface. In addition the heat rays that are radiated from the lower surface of the wafer and enter into the heat rays guide hole 22 are incident on an inner surface of the heat rays guide hole 22 to be reflected. Thereafter, the heat rays, as identical with the heat rays A to C, are reflected at the reflector 23, move in a sensor insertion hole 21 toward right in the figure and are captured by the temperature sensor 30 to detect as heat. Thus, the present heat treatment apparatus is constituted in the following manner. That is, on the upper surface of the susceptor 2 the heat rays guide hole 22 is bored. Thereby, the heat rays radiated from the wafer W proceed from the heat rays guide hole 22 through the reflector 23 at a bottom thereof to reach the temperature sensor 30 in the sensor insertion hole 22. Accordingly, the heat rays radiated from the wafer W can be directly captured by the temperature sensor 30 to detect. As a result of this, the temperatures of the wafer W can be detected with high accuracy to enable to implement precise heat treatment to the wafer W.

In addition to the above, heat rays are radiated also from heating lamps 7 as a heat source for supplying heat for heating the susceptor 2 and the wafer W. In the present heat treatment apparatus, the temperature sensor 30 is disposed inside of the susceptor 2. As a result of this, the heat rays radiated from the heating lamps 7 do not directly go to the temperature sensor 30 to be detected. Accordingly, the heat rays radiated from the heating lamps 7 are not detected as noise.

As a result of this, according to the present heat treatment apparatus, since the heat rays radiated from the heating lamps 7 are not detected as noise, S/N ratio is high and temperatures of the wafer W can be detected with high precision.

The temperature sensor 30 being inserted into the susceptor 2, the heat rays radiated from the susceptor 2 itself are naturally detected by the temperature sensor 30. However, the susceptor 2 being in close proximity of the wafer 2, it is considered that there is not a significant difference between temperature of the wafer W and that of the susceptor 2. Accordingly, the heat rays radiated from the susceptor 2 are construed not to be as noise in detecting the temperatures of the wafer W.

Thus, in the present heat treatment apparatus, a sensor rod of a radiation thermometer being inserted into a susceptor, stray rays from a heat source are shielded from reaching the sensor. Thus, since only thermal radiation energy from the wafer can be detected accurately by the radiation thermometer, measurement of the wafer temperatures can be accurately implemented with less error.

The present invention is not restricted to the range disclosed in the embodiments.

Figure 5:
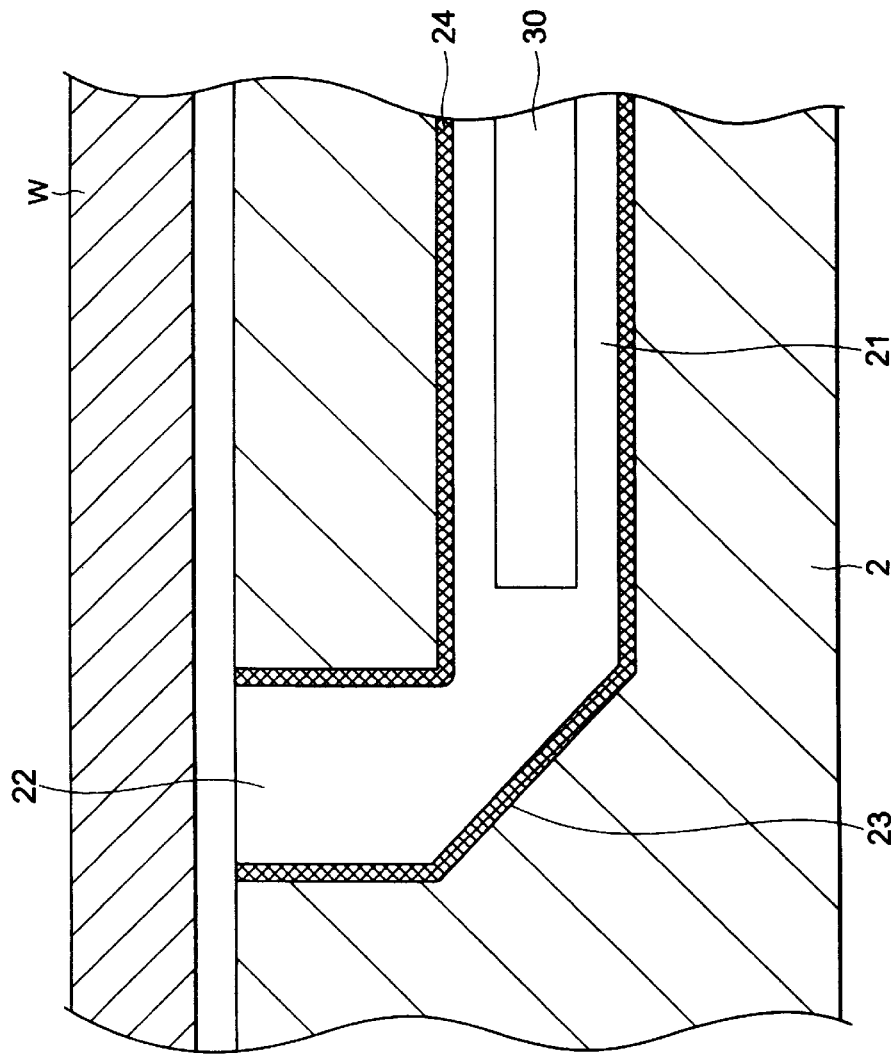
FIG. 5 is a vertical cross sectional view in which the surroundings of a heat rays guide hole of a susceptor is partly enlarged.

For instance, in the above embodiments, inside of the susceptor 2, only the sensor insertion hole 22 and the heat rays guide hole 22 communicated at the tip thereof are bored. Instead of this, an entire inner surface of these sensor insertion hole 21, heat rays guide hole 23, and reflector 23 that is a junction thereof, as shown in FIG. 5, may be coated by coating material 24 that well reflects the heat rays.

By coating thus, on reflecting at inner surfaces of the heat rays guide hole 22, the reflector 23 and the sensor insertion hole 21, the heat rays can be reduced in magnitude of attenuation. Here, the heat rays are ones that are radiated from the lower surface of the wafer W and enter the heat rays guide hole 22. As a result of this, the sensor 30 can detect the heat rays as if these directly arrived from the wafer W to the sensor 30. Accordingly, the temperatures of the wafer W can be more accurately detected.

As a material to be coated with a purpose of reflecting the heat rays, Au of high reflectivity is generally used. In this case, an emissivity of approximately 0.0 (reflectivity of 1.0) is obtained. When emissivity of 0.1 or less (reflectivity of 0.9 or more) can be obtained for the surface of the reflector and the inner surfaces, the temperature measurement according to the present invention can be implemented with sufficient accuracy. As a result of this, treatment of the surface of the reflector and inner surfaces can be appropriately selected in the range of the present invention.

Figure 6:
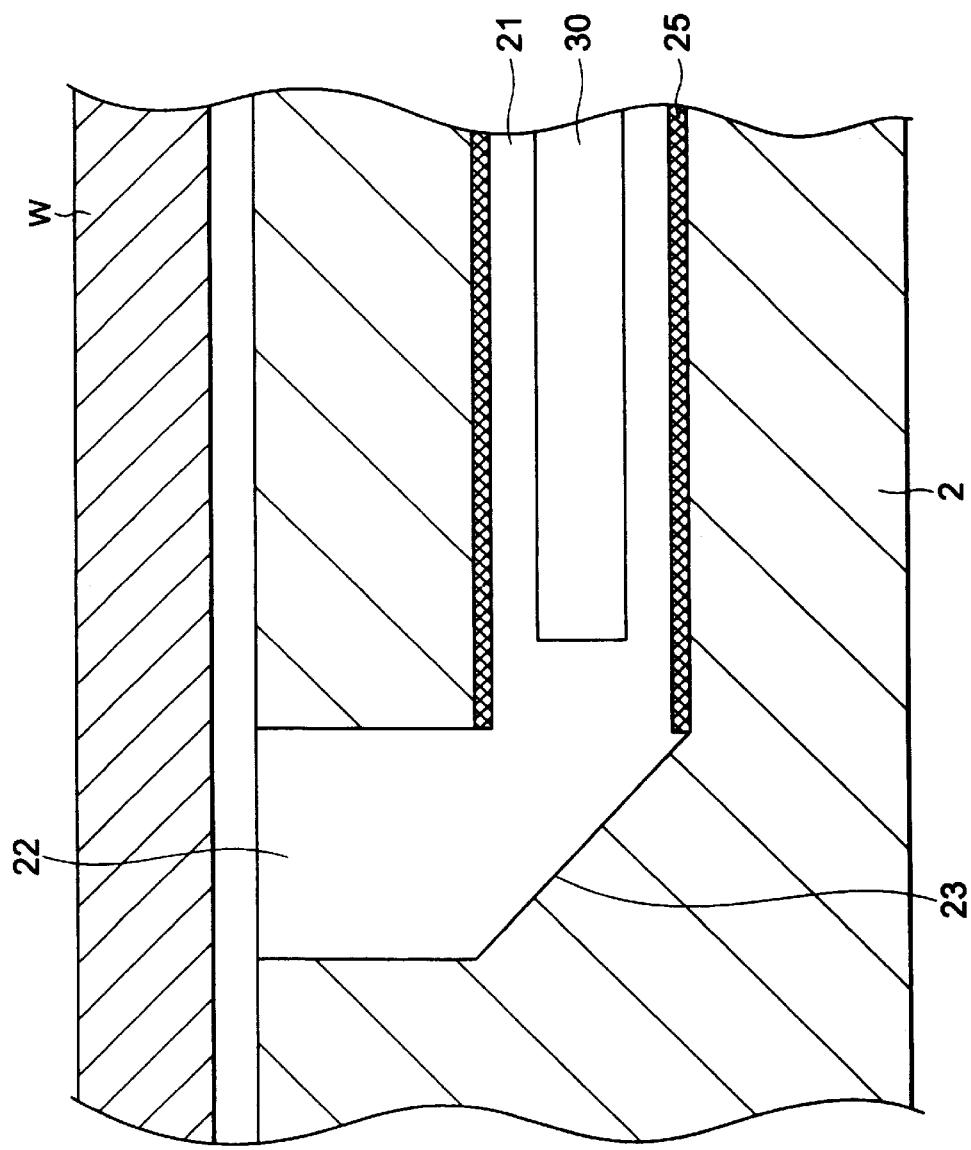
FIG. 6 is a vertical cross sectional view in which the surroundings of a heat rays guide hole of a susceptor is partly enlarged.

In the above example, the entire inner surfaces of the sensor insertion hole 21, the heat rays guide hole 23, and the reflector 23 that is a junction thereof is coated with coating material 24 that reflects the heat rays. As another example, instead of the aforementioned coating, slim tubes that are made in advance of the above coating material may be inserted into the heat rays guide hole 22 and the sensor insertion hole 21. FIG. 6 is a vertical cross sectional view showing a state where a tube 25 formed of the coating material is inserted into the sensor insertion hole 21.

By inserting thus the tube 25 made of the coating material to constitute, the process of coating the insides of the narrow heat rays guide hole 22 and sensor insertion hole 21 can be spared. Accordingly, manufacture can be simplified and manufacturing cost can be reduced. These are characteristic effects.

Figure 7:
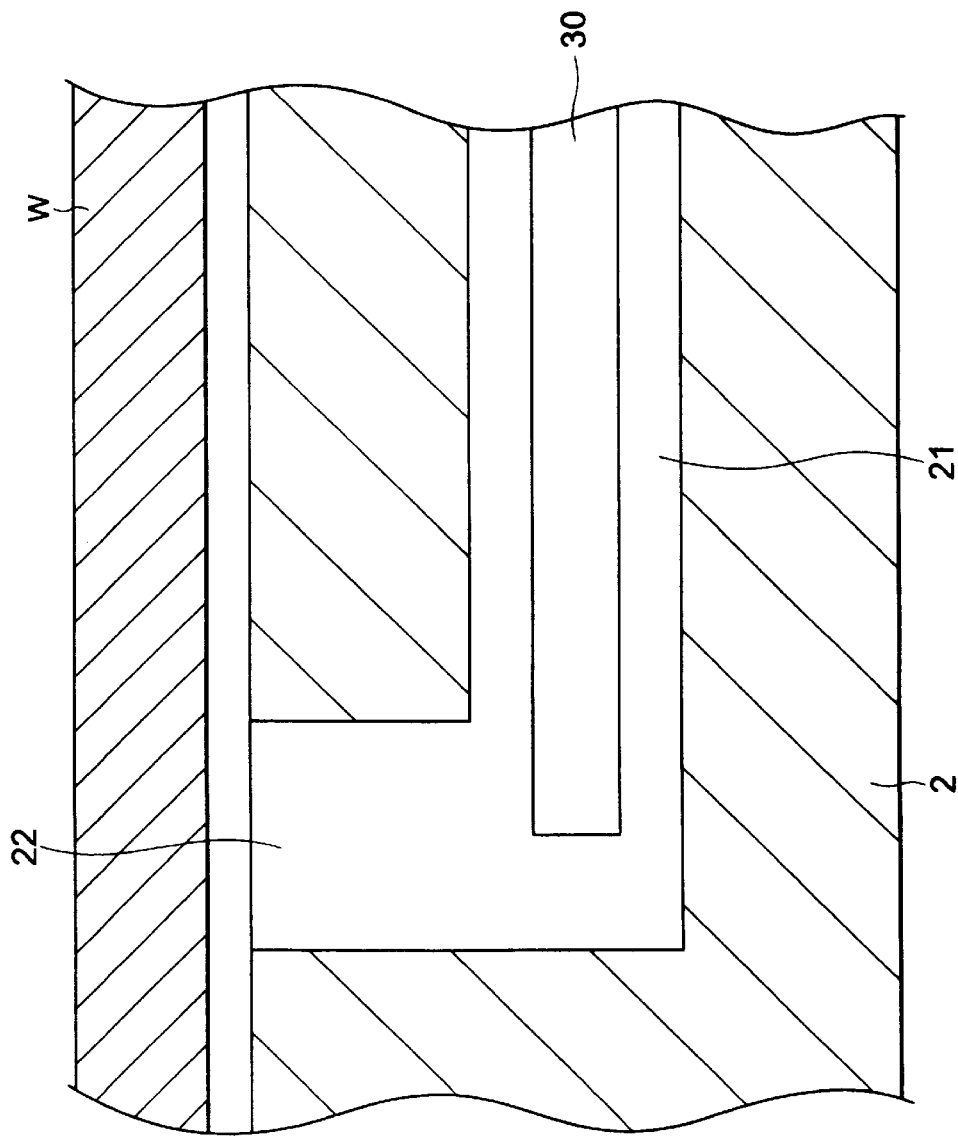
FIG. 7 is a vertical cross sectional view in which the surroundings of a heat rays guide hole of a susceptor is partly enlarged.

As still another example, the tips of the heat rays guide hole 22 and the sensor insertion hole 21, as shown in FIG. 7, may be constituted to be orthogonal to result in disposing the tip of the temperature sensor 30 just below the heat rays guide hole 22.

Thus, by disposing the tip of the temperature sensor 30 just below the heat rays guide hole 22, the heat rays radiated from the wafer W can directly reach the tip of the temperature sensor 30. Accordingly, the temperature of the wafer W can be detected with higher precision. Further, there being no need to form a tilted reflector 23 at the junction of the tips of the heat rays guide hole 22 and the sensor insertion hole 21, the manufacturing process can be simplified, resulting in an effect that can reduce the manufacturing cost.

(A Second Embodiment)

Next, a heat treatment apparatus involving a second embodiment according to the present invention will be explained.

The portions that duplicate with the above first embodiment will be omitted in explanation.

Figure 8:
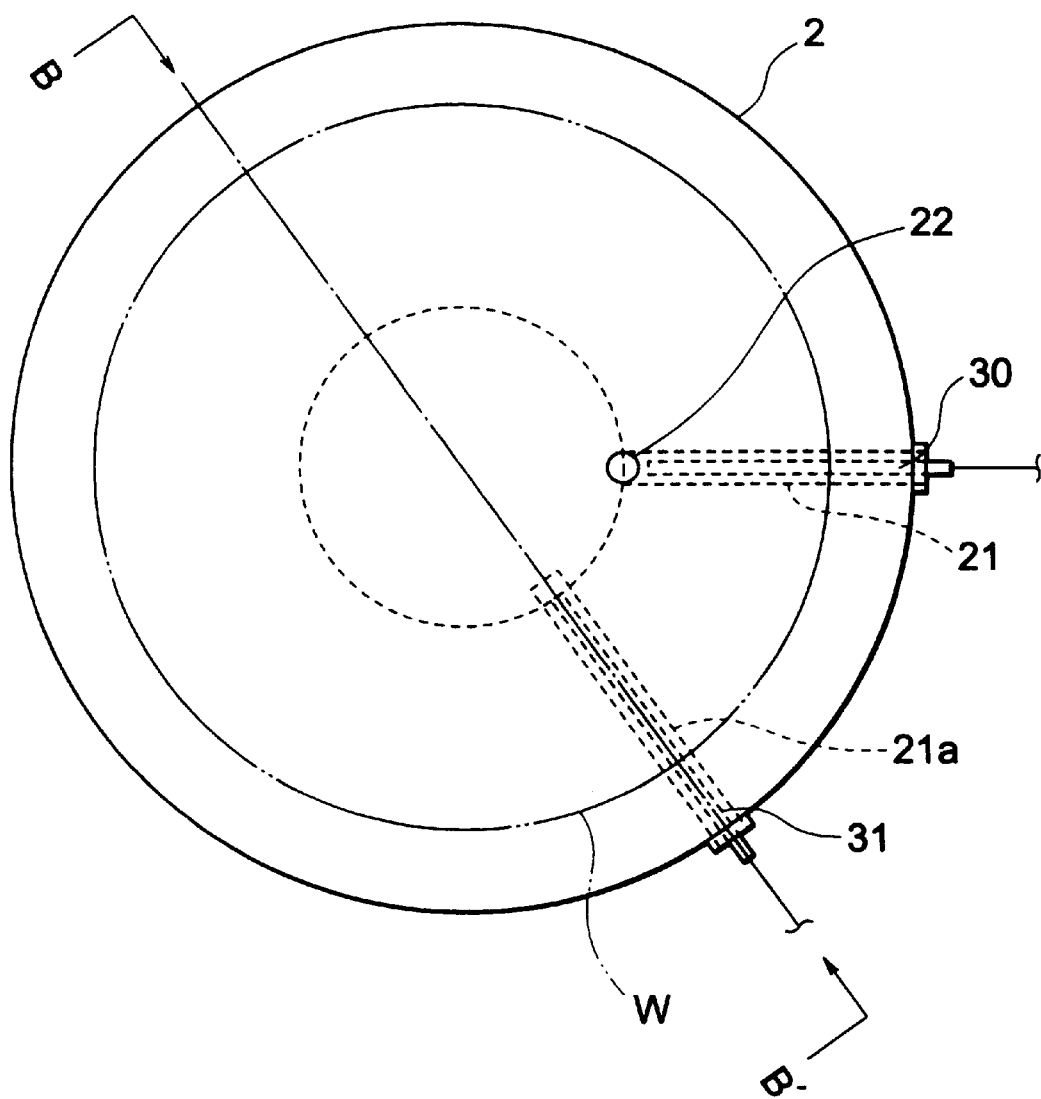
FIG. 8 is a plan view of a susceptor involving the present embodiment.
Figure 9:
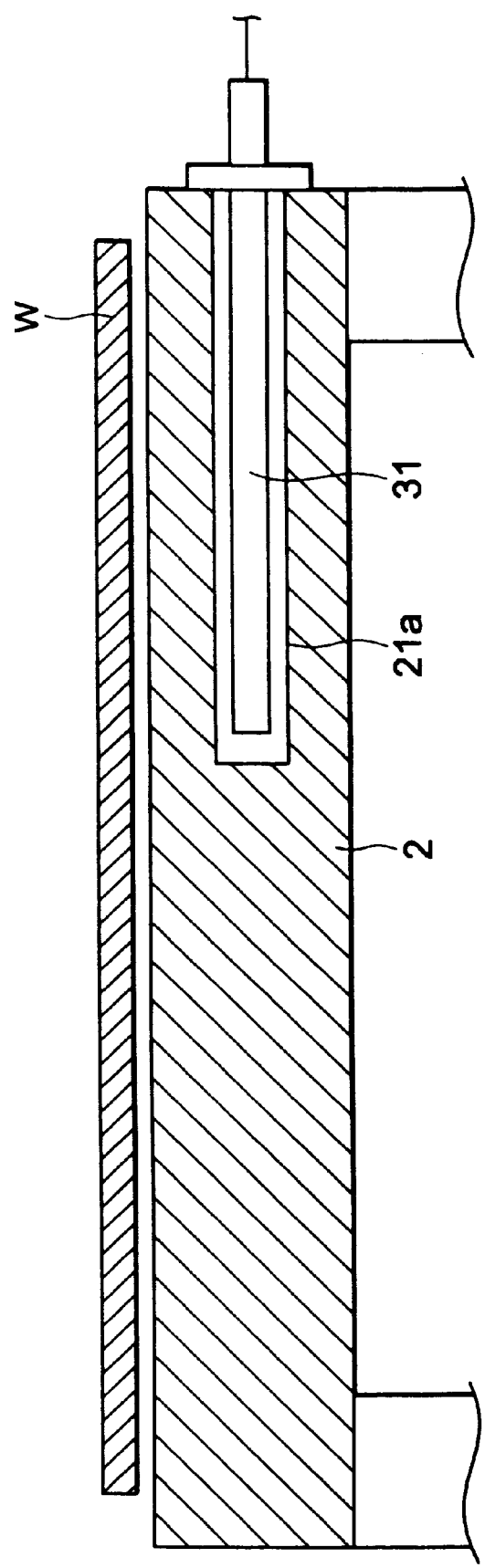
FIG. 9 is a vertical cross sectional view cut a susceptor involving the present embodiment along B–B' shown in FIG. 8.

FIG. 8 is a plan view showing a susceptor 2 involving the present invention, and FIG. 9 is a vertical cross sectional view cut the susceptor 2 along B–B'.

As shown in FIGS. 8 and 9, in the present heat treatment apparatus, a first temperature sensor 30 and a second temperature sensor 31 are disposed to the susceptor 2. Of these temperature sensors, the first temperature sensor 30 being identical with the temperature sensor 30 in the first embodiment, the detailed explanation is omitted.

Of these temperature sensors 30 and 31, the first temperature sensor 30 is one for detecting temperatures, and the second temperature sensor 31 is one for correcting the temperatures detected by the first one.

In temperature data detected by the first temperature sensor 30, in some cases, other than the net temperature data based on the heat rays from the wafer W, the heat rays from the heating lamps 7 enter through the susceptor 2 as noise. That is, the heat rays from the heating lamps 7 transmit a lower half of the susceptor 2 to be detected by the temperature sensor 30 inserted inside of the sensor insertion hole 21. This phenomenon can be confirmed when in a state where a wafer W of completely uniform temperature is disposed on the susceptor 2 or in a state where nothing is disposed on the susceptor 2, the heating lamps 7 are turned on to heat the susceptor 2.

That is, in a state where the heating lamps 7 are turned on to heat, a rotating unit 9 is operated as shown in FIG. 1 to rotate a rotary table 8 and the heating lamps 7 held thereon in a plane parallel with the susceptor 2. At this time, the detected temperatures vary periodically. That is, when the heating lamps 7 pass just below the temperature sensor 30, the temperature rises, and after the heating lamps 7 pass through just below the temperature sensor 30, the temperature goes down. This up and down movement of the detected temperatures is synchronized with the rotation of the heating lamps 7.

In the present heat treatment apparatus, considering such phenomena, a second temperature sensor 31 is disposed as a temperature sensor for correction.

The second temperature sensor 31 detects, of the heat rays radiated from the heating lamps 7, the heat rays arriving into the sensor insertion hole 21, that is, the heat rays as the noise. The heat rays arriving into the sensor insertion hole 21 come in the sensor insertion hole 21 after transmitting, to be specific, the susceptor 2 corresponding to the bottom of the sensor insertion hole 21 and to lower surface of the susceptor 2.

Accordingly, the second temperature sensor 31, as far as detection of the heat rays (heat rays noise) from the heating lamps 7 is concerned, is necessary to be disposed under conditions identical with those of the first temperature sensor 30.

That is, the size and shape of the second sensor insertion hole 21a are necessary to be identical with those of the first sensor insertion hole 21. The second sensor insertion hole 21a is disposed so that a temperature detector of the first temperature sensor 30 and that of the second temperature sensor 31 are on the same circle on the susceptor 2. For instance, a tip of the first sensor insertion hole 21 and the second sensor insertion hole 21a are preferable to be disposed on the same circle on the susceptor 2. The reason for disposing the tip of the first sensor insertion hole 21 and the second sensor insertion hole 21a on the same circle of the susceptor 2 is as follows. As shown in FIG. 1, since a plurality of heating lamps 7 rotates in a plane parallel with the susceptor 2. Accordingly, it is considered that, by disposing the temperature detectors of two temperature sensors 30 and 31 at an equal distance from a rotation center corresponding to rotation of the heating lamps 7, the difference caused by location can be cancelled out.

On the other hand, the second temperature sensor does not need to detect the heat rays from the wafer W. Accordingly, as shown in FIGS. 8 and 9, a penetrating hole such as the heat rays guide hole 22, and the reflector 23 are not required to dispose. Further, as the first temperature sensor 30, from a necessity of accurately detecting the heat rays from the wafer W, it is preferable to use a radiation thermometer of high measurement accuracy. However, the second temperature sensor 31 need only detect the heat rays (heat rays noise) going through the lower half of the susceptor 2 of the heat rays radiated from the heating lamps 7. Accordingly, as the second temperature sensor 31, a radiation thermometer is not necessarily required. That is, the existing thermocouple temperature sensor that has been used can be used. In that case, there is an advantage that a less expensive sensor can be used.

Next, a case where in a heat treatment apparatus involving the present embodiment the detected temperatures are being corrected will be explained.

In the heat treatment apparatus, both the first temperature sensor 30 and the second temperature sensor 31 are connected to a CPU that is not shown in the figure. The CPU implements correction of temperatures. That is, in heating with the wafer W disposed on the susceptor 2, two sensors of the first temperature sensor 30 and the second temperature sensor 31 detect temperatures. At this time, temperature data detected by the first temperature sensor 30 include, other than the heat rays radiated from the wafer W that are the net data, so-called heat noise. Here, the heat noise reaches from the heating lamps 7 transmitting the lower portion of the susceptor 2 to the first temperature sensor 30.

On the other hand, the temperature data detected by the second temperature sensor 31 are data of the so-called heat noise. Accordingly, by subtracting the data detected by the second temperature sensor 31 that are so-called noise data from the data detected by the first temperature sensor 30, the net data can be obtained. The CPU can instantaneously carry out such data calculation.

According to the present heat treatment apparatus, by subtracting the heat noise data detected by the second temperature sensor from the data detected by the first temperature sensor 30, the net data based on the heat rays radiated from the wafer W can be obtained. Accordingly, the temperatures of the wafer W can be detected more accurately, resulting in high precision temperature control during heat treatment of the wafer W.

(A Third Embodiment)

The present heat treatment apparatus, instead of actual measurement of the heat noise with the second temperature sensor 31 in the heat treatment apparatus of the second embodiment, is constituted to carry out subtraction of data of the heat noise by use of data operation.

That is, in the above second embodiment, other than the first temperature sensor 30, the second temperature sensor 31 always detects the heat noise. These two temperature sensors 30 and 31 are disposed so that the temperature detector portions thereof align on the same circle to actually detect the respective temperatures. By carrying out calculations between actual data of the temperatures detected by the respective temperature sensors 30 and 31, the temperature data based on the net heat rays radiated from the wafer W are found. In the present heat treatment apparatus, however, temperature measurement is implemented in the following manner. Instead of implementing successive measurements with the second temperature sensor 31, database of heat noise is prepared in advance from the actually measured values. When actually heating the wafer W, from the temperature data obtained through actual measurement by the temperature sensor 30, the heat noise data recorded in the database is subtracted to obtain the net temperatures of the wafer W. To be specific, into the second sensor insertion hole 31, a radiation thermometer identical with the first temperature sensor 30 in for instance type and properties is disposed. The above second sensor insertion hole 31 is identical with one used in the above second embodiment and of which tip is disposed on the same circle with the first temperature sensor 30. That is, with two identical radiation thermometers, one is set in the sensor insertion hole 21, and the other one is set in the sensor insertion hole 21a. In this state, with a wafer W for trial measurement maintained in known temperature circumstances, for instance, in completely uniform temperatures disposed on the susceptor 2, or with nothing disposed thereon, the heating lamps 7 are turned on to heat and rotate by the rotation unit 9. In this state, from data successively obtained by measuring with two temperature sensors 30 and 31, the heat noise component is obtained in the following ways.

The heat noise data thus obtained is stored in a memory to prepare the database.

In an actual heat treatment process of the wafer W in semiconductor manufacture, without disposing the temperature sensor 31 in the sensor insertion hole 21a, and with the temperature sensor 30 in the sensor insertion hole 21 only, the temperatures are detected. The data detected by the temperature sensor 30 is transferred to the CPU, at the CPU the net temperatures of the wafers W being estimated. That is, the CPU functions as an estimation means. To be specific, from actual data that the temperature sensor 30 detected, the above mentioned heat noise components are subtracted to estimate as the net temperature data, based on the estimated data, output of the heating lamps 7 being regulated.

Thus, in the present heat treatment apparatus, in advance the database of heat noise is prepared. From thus obtained database and the actual measurement data, the net temperatures are estimated. Accordingly, temperature regulation can be implemented with high precision. Further, though only for preparation of the database two radiation thermometers 30 and 31 are necessary, during the ordinary operation, only one radiation thermometer is necessary. Accordingly, there is no need for many expensive radiation thermometers being mounted, resulting in an advantage in manufacturing costs.

On the other hand, during preparation of the database of the heat noise, the radiation thermometer of high precision is used. Accordingly, the accuracy of the database, in other words, the accuracy of the estimated temperatures of the wafer W during the ordinary operation, can be obtained at high level, resulting in high precision temperature regulation of the wafer W.

As described in detail in the above, according to the present invention, a heat rays guide hole is disposed on an upper surface of a susceptor, therethrough the heat rays radiated from a substrate to be processed is directly guided to a temperature sensor. Thereby, the temperatures of the substrate to be processed can be directly detected.

In addition, since the temperature sensor is disposed in a sensor insertion hole disposed within a susceptor, the heat radiated from the heaters or the like other than the substrate to be processed is not caught. The temperatures of the substrate to be processed can be detected with high precision.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A heat treatment apparatus, comprising:
   a susceptor for heat-treating a substrate to be processed;
   a sensor insertion hole bored from a side surface of the susceptor toward a center portion;
   a heat rays guide hole in which an upper surface of the susceptor and a tip of the sensor insertion hole are communicated to guide heat rays radiated from the substrate to be processed;

a temperature sensor inserted into the sensor insertion hole;

heaters for heating the susceptor; and a regulator for regulating the heaters.

2. The heat treatment apparatus as set forth in claim 1:

wherein the temperature sensor is a radiation thermometer.

3. The heat treatment apparatus as set forth in claim 1:

wherein at a junction of the tip of the sensor insertion hole and the heat rays guide hole, a reflector is formed at an angle of 45° with respect to the surface of the susceptor.

4. The heat treatment apparatus as set forth in claim 2:

wherein at a junction of the tip of the sensor insertion hole and the heat rays guide hole, a reflector is formed at an angle of 45° with respect to the surface of the susceptor.

5. The heat treatment apparatus as set forth in claim 1:

wherein just below the heat rays guide hole, a tip of the temperature sensor is disposed.

6. The heat treatment apparatus as set forth in claim 4:

wherein the reflector has a surface of emissivity of 0.1 or less.

7. A heat treatment apparatus, comprising:

a susceptor for heat-treating a substrate to be processed;

a first sensor insertion hole bored from a side surface of the susceptor toward a center portion;

a heat rays guide hole in which an upper surface of the susceptor and a tip of the first sensor insertion hole are communicated to guide heat rays radiated from the substrate;

a first temperature sensor inserted into the first sensor insertion hole;

a second sensor insertion hole bored from the side surface of the susceptor toward a center portion thereof and having a tip end on a same circle with the heat rays guide hole;

a second temperature sensor inserted into the second sensor insertion hole;

heaters for heating the susceptor; and a regulator for regulating the heaters.

8. The heat treatment apparatus as set forth in claim 7:

wherein the first temperature sensor is a radiation thermometer.

9. The heat treatment apparatus as set forth in claim 8:

wherein the second temperature sensor is a radiation thermometer or a thermocouple temperature sensor.

10. A heat treatment apparatus, comprising:

a susceptor for heat-treating a substrate to be processed;

a sensor insertion hole bored from a side surface of the susceptor toward a center portion;

a heat rays guide hole in which an upper surface of the susceptor and a tip of the sensor insertion hole are communicated to guide heat rays from the substrate to be processed;

a radiation thermometer inserted into the sensor insertion hole;

heaters for heating the susceptor;

a means for estimating temperatures of various portions of the susceptor based on temperatures detected by the radiation thermometer; and a regulator for regulating the heaters based on the detected temperatures and the estimated temperatures.

11. A heat treatment method characterized in that heat rays radiated from a substrate to be processed is led into a heat rays guide hole disposed on a surface of a susceptor, and reflected toward a sensor insertion hole communicated at a bottom portion of the heat rays guide hole, thereby enabling to detect the heat rays by a temperature sensor inserted into the sensor insertion hole and regulate heaters for heating the susceptor based on the detected temperatures.

12. The heat treatment method as set forth in claim 11:

wherein the heat rays are reflected in an orthogonal direction with respect to the heat rays guide direction and with emissivity of 0.1 or less, and the temperature sensor is a radiation thermometer.

13. A method of heat treatment, comprising the steps of:

while guiding heat rays radiated from a substrate to be processed into heat rays guide hole disposed on a surface of a susceptor to reflect toward a first sensor insertion hole communicated at a bottom portion of the heat rays guide hole, thereby enabling for a first temperature sensor inserted into the first sensor insertion hole to detect the heat rays;

detecting, of the heat rays supplied from heaters to the susceptor, heat rays permeating into a second sensor insertion hole disposed inside of a susceptor with a second temperature sensor inserted into a second sensor insertion hole;

obtaining, from temperatures detected by the first temperature sensor and temperatures detected by the second temperature sensor, net temperatures of the substrate to be processed; and regulating, based on the obtained net temperatures of the substrate to be processed, heaters for heating the susceptor.

14. The method of heat treatment as set forth in claim 13:

wherein the first temperature sensor is a radiation thermometer, and the second temperature sensor is a radiation thermometer or a thermocouple temperature sensor.

* * * * *

UNITED STATES PATENT AND TRADEMARK OFFICE
CERTIFICATE OF CORRECTION

PATENT NO.   : 6,262,397 B1
DATED        : July 17, 2001
INVENTOR(S)  : Yazawa

It is certified that error appears in the above-identified patent and that said Letters Patent is hereby corrected as shown below:

Column 4,
Line 61, change "2a" to -- 2b --;

Column 6,
Lines 17 and 55, change "22" to -- 21 --;
Line 39, change "2" (second occurrence) to -- W --;
Line 58, change "23" (first occurrence) to -- 22 --;

Column 7,
Line 14, change "23" to -- 22 --;

Column 9,
Line 56, change "31" to -- 21a --; and
Line 58, change "31" to -- 21a --.

Signed and Sealed this

Eighteenth Day of June, 2002

*Attest:*

JAMES E. ROGAN
*Attesting Officer*     *Director of the United States Patent and Trademark Office*